United States Patent
Safa-Bakhsh

(10) Patent No.: US 10,096,178 B2
(45) Date of Patent: Oct. 9, 2018

(54) REDUCING NUISANCE FAULT INDICATIONS FROM A VEHICLE USING PHYSICS BASED AND DATA DRIVEN MODELS

(71) Applicant: THE BOEING COMPANY, Chicago, IL (US)

(72) Inventor: Robab Safa-Bakhsh, Ambler, PA (US)

(73) Assignee: The Boeing Company, Chicago, IL (US)

(*) Notice: Subject to any disclaimer, the term of this patent is extended or adjusted under 35 U.S.C. 154(b) by 108 days.

(21) Appl. No.: 15/397,404

(22) Filed: Jan. 3, 2017

(65) Prior Publication Data
US 2018/0190048 A1 Jul. 5, 2018

(51) Int. Cl.
*G07C 5/08* (2006.01)
*G06F 11/27* (2006.01)
*G06N 7/00* (2006.01)
*G01R 19/165* (2006.01)
*B64D 45/00* (2006.01)

(52) U.S. Cl.
CPC ............ *G07C 5/0816* (2013.01); *G06F 11/27* (2013.01); *G06N 7/005* (2013.01); *G07C 5/0808* (2013.01); *B64D 2045/0085* (2013.01); *G01R 19/165* (2013.01)

(58) Field of Classification Search
CPC ..... G07C 5/0808; G07C 5/0816; G06F 11/27; G06F 11/0739; G06F 11/079; G06F 11/3013; G06F 3/0484; G06F 11/261; G06N 7/005; G01R 19/165; B64D 2045/0085

See application file for complete search history.

(56) References Cited

U.S. PATENT DOCUMENTS

| | | | | |
|---|---|---|---|---|
| 5,184,312 A | * | 2/1993 | Ellis | ............ G05D 1/0077 702/121 |
| 6,918,134 B1 | * | 7/2005 | Sherlock | ........... B64D 11/0015 348/837 |
| 2013/0274992 A1 | * | 10/2013 | Cheriere | .............. B64F 5/0081 701/32.9 |
| 2017/0088290 A1 | * | 3/2017 | Szeto | ....................... B64F 5/60 |

* cited by examiner

*Primary Examiner* — Dale Moyer
(74) *Attorney, Agent, or Firm* — Womble Bond Dickinson (US) LLP

(57) ABSTRACT

An off-board apparatus is provided for reducing nuisance fault indications from a vehicle. The apparatus is communicably coupled to a vehicle health monitoring (VHM) system, or one or more vehicle systems for at least collecting and communicating data thereto such as data that indicates fault generated by a line replaceable unit of the vehicle in response to a built-in test. The apparatus is also coupleable with a computerized maintenance management system configured to store data that describes a historical condition and maintenance of the vehicle. The apparatus is programmed to determine a probability of validity or invalidity of the fault indication, determine a condition indicator for the signal path based on the LRUs current and historical operational environment, and generate a notification, or output the fault indication for generation of a notification, only in an instance in which the fault indication, with a high probability is valid.

21 Claims, 5 Drawing Sheets

REDUCING NUISANCE FAULT INDICATIONS FROM A VEHICLE USING PHYSICS BASED AND DATA DRIVEN MODELS

TECHNOLOGICAL FIELD

The present disclosure relates generally to vehicle health management and, in particular, to reducing nuisance fault indications from a vehicle using physic-based and data-driven models.

BACKGROUND

Vehicles today make increasing use of electronic components for providing monitoring and control of vehicle subsystems and components, but this has the potential to adversely impact the overall maintainability of the vehicle. This is a result of the electronic components generating nuisance fault indications, which leads to unnecessary removals and maintenance of the components and subsequent periods of inoperability of the vehicle overall. Built in tests (BIT) are designed to check the hardware operational status. This includes assessing the availability of appropriate power and signal levels beyond established thresholds, the health of electronic components, interfacing components, sensors, actuators, and the like. Most often, these signals are compared to a fixed threshold level and alerts are generated if they not within a requisite range. The current solutions do not take into consideration the operating environment, the condition of the electronic components and the interconnecting systems, when the alerts are created. This will lead to generation of nuisance failure indications, resulting in unnecessary removals and increased maintenance cost.

For example, under normal environmental conditions, an electronic component that is configured to operate using 5 volts (v) of power, may nonetheless have a satisfactory operational status in response to receiving a voltage that is below the 5 volt threshold but within an acceptable voltage range (e.g., a 5 volt (v) power source configured to provide a minimum of 4.00 v and providing 4.3 v to the electronic component). However, under extreme environmental conditions (e.g., within extreme heat, high vibration or humidity), the electronic component may have a non-satisfactory operational status in response to receiving a lower voltage (e.g., 3.5 volts, which is not sufficient for operation of a particular electronic component.). This will result in the generation of a nuisance fault indication, and subsequent removal of the component for testing. After removal and during testing of the component, the environmental conditions are restored to normal conditions, and the power source supplying the voltage will also differ or provide a higher voltage output, such that the testing of the electronic component results in no fault being found.

Therefore, it may be desirable to have a system and method that take into account at least some of the issues discussed above, as well as possibly other issues.

BRIEF SUMMARY

Example implementations of the present disclosure are directed to an improved apparatus, method and computer-readable storage medium for reducing nuisance fault indications from a vehicle such as an aircraft, ground vehicle and ship equipped with line replaceable units (LRUs). Example implementations reduce nuisance faults by weighing factors that impact the behavior of the electronic components and signal interconnections within a LRU that generates fault indications such as caution warning and advisories (CWAs). These factors include, for example, operating temperature, humidity, vibration or shock, aging, interaction with other systems, maintenance history and component repair effectiveness, and the like.

Example implementations combine physics-based and data-driven approaches. A physical model is used to predict behavior of the LRU as the result of aging, exposure to environmental conditions such as heat, vibration and humidity and external loading. In addition, the influence of these environmental factors on measured parameters are modeled and calculated. For example, if the supply voltage at certain temperature and vibration is reduced as the result of increased resistance in the connectors and wiring harnesses, it will drive a measured parameter lower than the set threshold resulting in turning a BIT on. Once the condition is alleviated, the BIT will go off and cannot be repeated after the LRU is removed from aircraft.

The physical model provides a measure of condition and health of each signal path where a fault indication is created. This condition indicator will be used to assess the validity of a fault indication.

Data driven models take advantage of maintenance and operational history. These include data related to the historical operational environment, validity of a fault indication, fix effectiveness and all the relevant information that can contribute to determining the validity or falsity for a given fault indication. The present disclosure includes, without limitation, the following example implementations.

Some example implementations provide a method for reducing nuisance fault indications from a vehicle equipped with line replaceable units (LRUs) including electronic hardware. The apparatus is communicably coupled to a vehicle health monitoring (VHM) system, or one or more vehicle systems for at least collecting and communicating data thereto. The method comprises receiving, by at least one communications interface coupleable with the VHM, data including a fault indication generated by a LRU of the LRUs in response to a built-in test (BIT) in which a BIT signal is output from a signal path through the electronic hardware in a current operational environment. The at least one communications interface is also coupleable with a computerized maintenance management system (CMMS) configured to store data that describes a historical condition and maintenance of the vehicle.

The method also comprises determining, by the processing circuitry, a condition indicator for the signal path based on the current operational environment, and a transformation of operational environment to condition indicator derived from a computer model of the LRU that describes structural mechanics of the LRU, and the mechanical and thermal stress of the LRU for a plurality of operational environments. The method also comprises determining, by processing circuitry coupled to the at least one communications interface, a probability of validity or invalidity of the fault indication based on an analysis of the fault indication, data from the one or more vehicle systems other than the fault indication, and data from the CMMS, and the condition indicator. The method also comprises multiplying the condition indicator by the probability of validity or invalidity of the fault indication to create a BIT signal validity score.

The method also comprises setting, by the processing circuitry, a threshold based on the probability and the maintenance data. The method also comprises determining, by the processing circuitry, if the fault indication is valid or invalid based on a comparison of the BIT signal validity score and the threshold. The method also comprises generating, by the processing circuitry, a notification, or output the fault indication for generation of a notification, only in an instance in which the fault indication is valid, or otherwise discarding the fault indication.

In some example implementations of the method of the preceding or any subsequent example implementation, or any combination thereof, the operational environment is defined by at least one of a temperature, humidity, vibration, age or shock factor for the electronic hardware, or interaction between the LRU and at least one other LRU.

In some example implementations of the method of any preceding or any subsequent example implementation, or any combination thereof, the data from the CMMS from which the probability is determined includes historical fault indications for the LRU, each of which is indicated as valid or invalid based on a historical effectiveness of repairs and maintenance actions for the LRU.

In some example implementations of the method of any preceding or any subsequent example implementation, or any combination thereof, the data from the one or more vehicle systems other than the fault indication from which the probability is determined includes parameters that describe the current operational environment.

In some example implementations of the method of any preceding or any subsequent example implementation, or any combination thereof, the method further comprises deriving the transformation, including for each operational environment of the plurality of operational environments, configuring the computer model to describe structural mechanics of the electronic hardware, and mechanical and thermal stress on the electronic hardware, for the LRU operational environment; and with the computer model so configured, applying an input signal to the computer model to cause an output signal from a corresponding signal path for the signal path through the electronic hardware; and determining a condition indicator for the signal path for the LRU operational environment based on the input signal and the output signal.

In some example implementations of the method of any preceding or any subsequent example implementation, or any combination thereof, determining if the fault indication is valid or invalid includes determining that the BIT signal is valid in an instance in which a value of the BIT signal validity score is less than the threshold that defines an upper acceptable limit, or greater than the threshold that defines a lower acceptable limit.

In some example implementations of the method of any preceding or any subsequent example implementation, or any combination thereof, generating the notification, or output the fault indication for generation of the notification, includes outputting the notification or the fault indication to the CMMS to cause the CMMS to automatically schedule a maintenance activity for the LRU based thereon.

In some example implementations, an apparatus is provided for reducing nuisance fault indications from a vehicle equipped with LRUs including electronic hardware, and a VHM system. The apparatus comprises a processing circuitry and a memory storing executable instructions that, in response to execution by the processing circuitry, cause the apparatus to implement a number of subsystems, such as a modeler, data analysis engine, threshold setter, and reasoner that are configured to at least perform the method of any preceding example implementation, or any combination thereof.

In some example implementations, a computer-readable storage medium is provided for reducing nuisance fault indications from a vehicle equipped with line replaceable units (LRU) including electronic hardware, and an vehicle health monitoring (VHM) system. The computer-readable storage medium is non-transitory and has computer-readable program code portions stored therein that, in response to execution by a processing circuitry, cause an apparatus to at least perform the method of any preceding example implementation, or any combination thereof.

These and other features, aspects, and advantages of the present disclosure will be apparent from a reading of the following detailed description together with the accompanying drawings, which are briefly described below. The present disclosure includes any combination of two, three, four or more features or elements set forth in this disclosure, regardless of whether such features or elements are expressly combined or otherwise recited in a specific example implementation described herein. This disclosure is intended to be read holistically such that any separable features or elements of the disclosure, in any of its aspects and example implementations, should be viewed as intended, namely to be combinable, unless the context of the disclosure clearly dictates otherwise.

It will therefore be appreciated that this Brief Summary is provided merely for purposes of summarizing some example implementations so as to provide a basic understanding of some aspects of the disclosure. Accordingly, it will be appreciated that the above described example implementations are merely examples and should not be construed to narrow the scope or spirit of the disclosure in any way. Other example implementations, aspects and advantages will become apparent from the following detailed description taken in conjunction with the accompanying drawings which illustrate, by way of example, the principles of some described example implementations.

BRIEF DESCRIPTION OF THE DRAWING(S)

Having thus described example implementations of the disclosure in general terms, reference will now be made to the accompanying drawings, which are not necessarily drawn to scale, and wherein:

DETAILED DESCRIPTION

Figure 1:
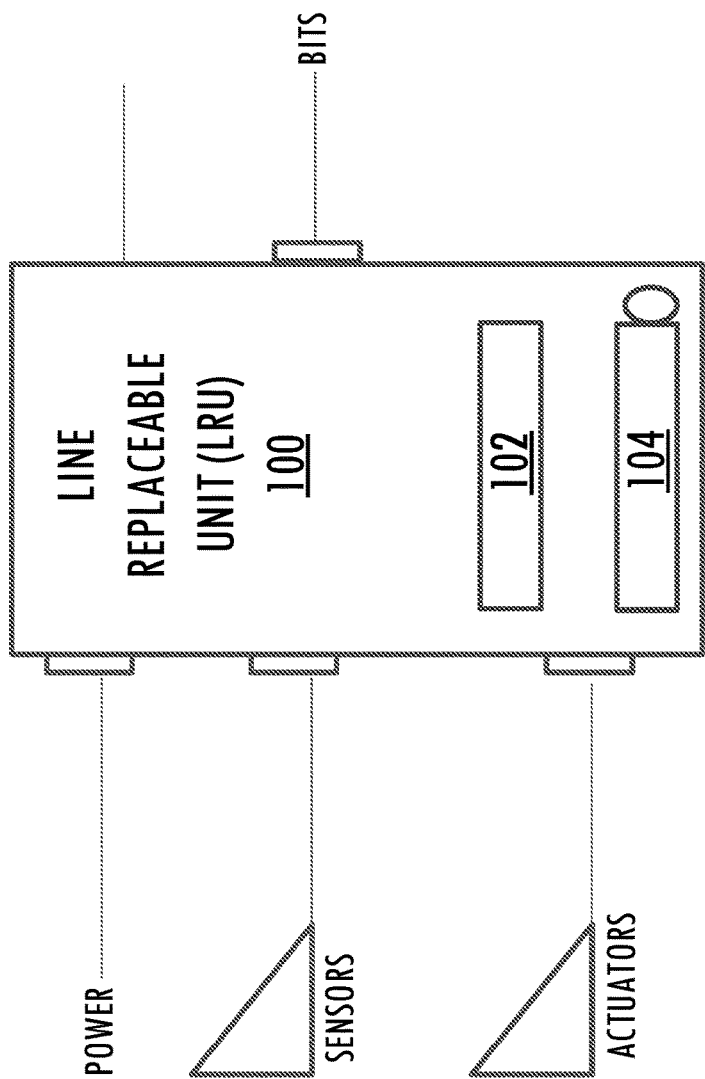
FIG. 1 is an illustration of a line replaceable unit (LRU), according to example implementations of the present disclosure.

Some implementations of the present disclosure will now be described more fully hereinafter with reference to the accompanying drawings, in which some, but not all implementations of the disclosure are shown. Indeed, various implementations of the disclosure may be embodied in many different forms and should not be construed as limited to the implementations set forth herein; rather, these example implementations are provided so that this disclosure will be thorough and complete, and will fully convey the scope of the disclosure to those skilled in the art. For example, unless otherwise indicated, reference to something as being a first, second or the like should not be construed to imply a particular order. Also, for example, reference may be made herein to quantitative measures, values, relationships or the like. Unless otherwise stated, any one or more if not all of these may be absolute or approximate to account for acceptable variations that may occur, such as those due to engineering tolerances or the like. Like reference numerals refer to like elements throughout.

Example implementations of the present disclosure are generally directed to vehicle health monitoring and, in particular, to reducing nuisance fault indications from a vehicle. Example implementations will be primarily described in conjunction with applications for vehicle maintenance and monitoring systems. It should be understood, however, that example implementations may be utilized in conjunction with a variety of other applications, such as other applications within the aerospace industry and outside of the aerospace industry in which the vehicle is an aircraft. Other examples of suitable vehicles land vehicles, spacecraft, watercraft and the like.

More particularly, example implementations of the present disclosure reduce nuisance fault indications from a vehicle using a combination of physics-based and data-driven modeling approaches. For example, computer models are used to predict the behavior of the electronic hardware within the vehicle as the result of aging, and exposure to environmental conditions such as heat, vibration, humidity and external loading. In particular, the influence of these environmental conditions, on measured parameters of the electronic hardware, are modeled and calculated. For example, if the supply voltage at particular temperature and vibration is reduced as the result of increased resistance in the electronic hardware (e.g., connectors and wiring harnesses), it will drive a measured parameter lower than a set threshold, steadily or intermittently, for identifying a fault, and thereby result in the generation of a nuisance fault indication. The computer models are also used to determine a measurement or indicator of the condition and health of each signal path where the fault indication is created. This condition indicator is then used to assess the validity of the fault indication. Data such as maintenance and vehicle operational history is also used to determine the validity of fault indications.

FIG. 1 illustrates a suitable line replaceable unit (LRU) 100 configured to generate fault indications for a vehicle. As shown, an LRU includes electronic hardware 102 coupled to a printed circuit (PC) board 104 having interconnecting traces and connectors that connect the PC board to outside sensors, actuator, and power. The LRU is interconnected to one or more external LRUs through wired connections or wireless communication. The LRU during operation is subject to environmental conditions that impact its aging and operation. For example, extreme heat or temperature can impact the life of soldier joints within the LRU, or the quality and the resistance of connection. In another example, vibration can impact the life and performance of solder joints and connectors. Any high resistance or intermittency at the connectors may influence the amplitude of the input signal read by the electronic components on the PC board. This results in the BIT indicating a nuisance fault while within the temporary condition of the environment. Once the condition is eliminated, such as when the LRU is removed from the vehicle and tested, no fault is found.

Figure 2:
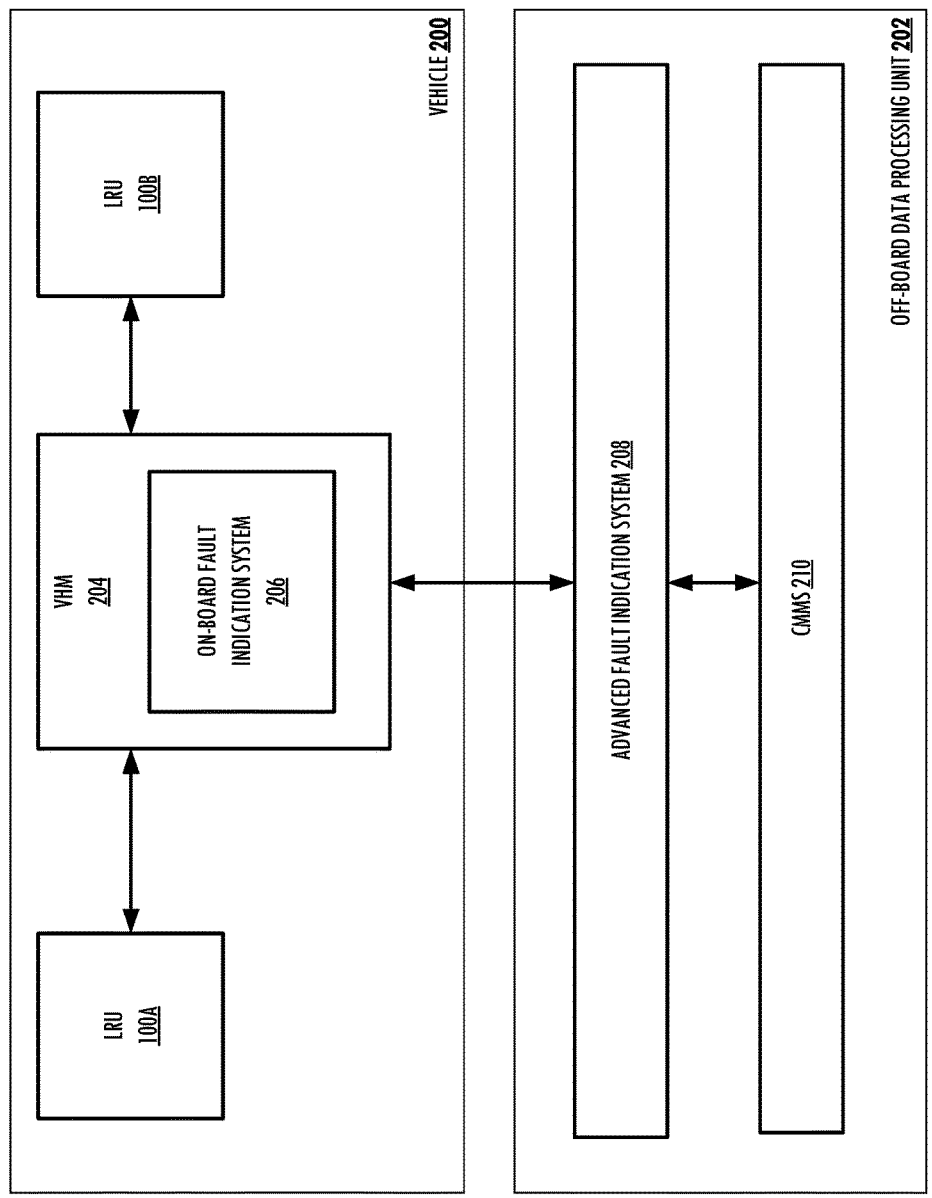
FIG. 2 is an illustration of a vehicle coupleable with a computerized maintenance management system (CMMS), according to example implementations of the present disclosure.

FIG. 2 illustrates a vehicle 200 operatively coupled to an off-board data processing unit 202. The vehicle is equipped with a vehicle health monitoring system (VHM) 204 having an on-board fault indication system 206 therein, and a plurality of LRUs (two of which are shown in particular as LRUs 100A, 100B). The fault indication system is coupled to the VHM to enable the receipt of data that indicates faults generated by the LRU in response to a built-in test (BIT). In some examples, the one or more vehicle systems provide data to the VHM. For example, if a vehicle does not include a dedicated VHM, the other vehicle systems can function as a collector and communicator of VHM data to the off-board data processing unit. The BIT signal is output from a signal path through the electronic hardware in a current operational environment. These tests are performed at start up (SBIT), by request from another system (IBIT), or periodic, on a certain intervals (PBIT) which is also equivalent to continuous BIT (CBIT). The results of the BIT test are communicated to the VHM directly or via other LRUs. As shown, in some examples, the VHM facilitates the communication of LRU BIT data with the off-board data processing unit 202.

The off-board data processing unit 202 includes an advanced fault indication system 208 configured to further analyze the BIT data. The advanced fault indication system is coupleable with a maintenance management system (CMMS) 210 which is configured to store data that describes a historical condition and maintenance of the vehicle. The CMMS may be composed of one or more computer systems including a monitor, processing circuitry and storage for storing large volumes of maintenance and operational data such as tear down, engineering investigations and ground testing of LRUs to correlate truth data (valid failures) with the BIT results. It should also be understood that either of the subsystems of the vehicle may function or operate as a separate system without regard to others of the subsystems. And further, it should be understood that the vehicle may include one or more additional or alternative subsystems than those shown in FIG. 2. For instance, although illustrated separately, the CMMS is included within the vehicle in some examples.

Figure 3:
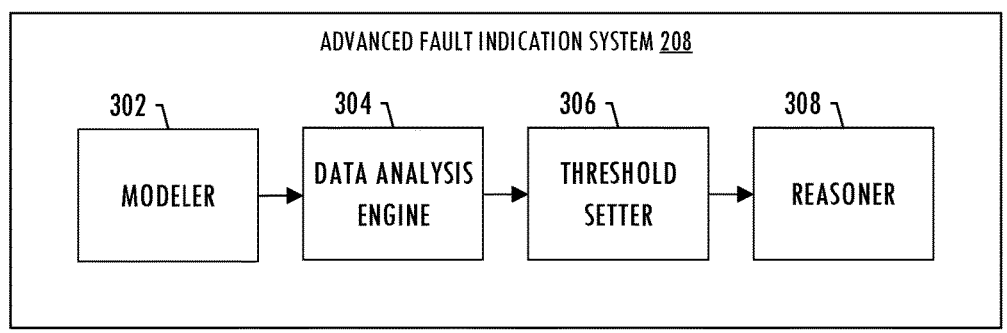
FIG. 3 is an illustration of a system for reducing nuisance fault indications from a vehicle using physics-based and data-driven models, according to example implementations of the present disclosure.

FIG. 3 more particularly illustrates the advanced fault indication system 208 for reducing nuisance fault indications from the vehicle 200 equipped with the LRUs 100 including electronic hardware 102, and the vehicle health monitoring (VHM) system 202. The advanced fault indication system of example implementations may simply be referred to as the "system" herein. The system is configured to perform a number of different functions or operations, either automatically, under direct operator control, or some combination of thereof. In some examples, the system is configured to perform one or more of its functions or operations automatically, that is, without being directly controlled by an operator. Additionally or alternatively, in some examples, the system is configured to perform one or more of its functions or operations under direct operator control.

In accordance with example implementations of the present disclosure, the system 208 is configured to perform various functions or operations to reduce nuisance fault indications from the vehicle 200. In some example implementations, the system is configured to determine a condition indicator for a signal path of the LRU based on the current operational environment, and determine a transformation of the operational environment to a condition indicator derived from a computer model of the LRU. The derived condition indicator describes structural mechanics of the LRU and the mechanical and thermal stress on the LRU, for a plurality of operational environments. The system is then configured to determine a probability of validity or invalidity of fault indications. The probability is determined based on an analysis of the fault indication, data (other than the fault indication) from the VHM system 204 or another vehicle system, data from the CMMS 210, and the condition indicator. The system then multiples the condition indicator by the probability of validity or invalidity of the fault indication to create a BIT signal validity score, and further sets a threshold based on the probability and the maintenance data of the vehicle, determines if the fault indication is valid or invalid based on a comparison of the BIT signal validity score and the threshold, and generates a notification, or output the fault indication for generation of a notification, only in an instance in which the fault indication is valid, or otherwise discards the fault indication.

The system 208 may include one or more of each of a number of different subsystems (each an individual system) coupled to one another for performing one or more functions or operations. As shown in FIG. 3, in some examples, the system includes a modeler 302, data analysis engine 304, threshold setter 306 and reasoner 308 coupled to one another. Although shown as part of the system, the modeler, data analysis engine, threshold setter or reasoner may instead be separate from but in communication with the system. It should also be understood that either of the subsystems may function or operate as a separate system without regard to others of the subsystems. And further, it should be understood that the system may include one or more additional or alternative subsystems than those shown in FIG. 3.

As explained in greater detail below, the modeler 302, data analysis engine 304, threshold setter 306 and reasoner 308 are configured to perform respective functions or operations of the system 208. The modeler generates a computer model to describe the structural mechanics of the electronic hardware 102 of the LRU 100, and the mechanical and thermal stress on the electronic hardware, for a plurality of operational environments. As used herein, the operational environment is defined by at least one of a temperature, humidity, vibration, age or shock factor for the electronic hardware, or an interaction between the LRU and at least one other LRU.

The data analysis engine 304 determines a condition indicator for the signal path based on the current operational environment, and further determines a transformation of the operational environment to a condition indicator derived from the computer model of the LRU 100. In some examples, this includes the data analysis engine being configured to derive the transformation, for each operational environment of the plurality of operational environments. Physical models are used to determine the integrity of each signal path. For example, in some implementations, the condition indicator for a fully healthy path is assigned a maximum value of 1, a non-functional path is assigned a condition indicator of zero, and signal paths with intermediate health are assigned values in between, based on profiles derived from stress models. In particular, the data analysis engine is configured to apply an input signal to the computer model to cause an output signal from a corresponding signal path for the signal path through the electronic hardware 102, and determine a condition indicator for the signal path for the operational environment based on the input signal and the output signal. For example, the condition indicators for a first input signal may vary under respective first, second and third environmental conditions to 0.1, 0.3, 0.5 and 0.8. Similarly, the condition indicators for a second input signal may vary under the respective first, second and third environmental conditions to 0.2, 0.3, 0.5 and 0.7.

The data analysis engine also 304 determines a probability of validity or invalidity of the fault indication. This determination is based on an analysis of the fault indication, data other than the fault indication from the VHM system 204 or another vehicle system, historical maintenance data from the CMMS, and the condition indicator. For example, for a conventional probability calculation, if there are 1000 fault indication instances and 500 of those instances are found to be valid fault indication based on maintenance and inspection data, the probability of validity is 500 divided by 1000 or 0.5. Various types of statistical analysis can be applied to determine probability of false indications or true fault indications. In some examples, the data from the VHM system or the other vehicle system other than the fault indication, from which the probability is determined, includes parameters that describe the current operational environment. Further, in some examples, the data from the CMMS from which the probability is determined includes historical fault indications for the LRU 100, each of which is indicated as valid or invalid, and maintenance actions. The data analysis engine further multiplies the condition indicator by the probability of validity or invalidity of the fault indication to create a BIT signal validity score;

The threshold setter 306 is configured to set a threshold based on the probability and is derived from maintenance data (e.g., truth data). The reasoner 308 is configured to determine if the fault indication is valid or invalid based on a comparison of the BIT signal validity score and the threshold. In some examples, this includes the reasoner being configured to determine that the BIT signal is valid in an instance in which a value of the BIT signal validity score is less than the threshold that defines an upper acceptable limit, or greater than the threshold that defines a lower acceptable limit. The reasoner is also configured to generate a notification, or output the fault indication for generation of a notification, only in an instance in which the fault indication is valid, or otherwise discard the fault indication. In some examples, this includes the reasoner being configured to output the notification or the fault indication to the CMMS to cause the CMMS to automatically schedule a maintenance activity for the LRU based thereon.

Figure 4:
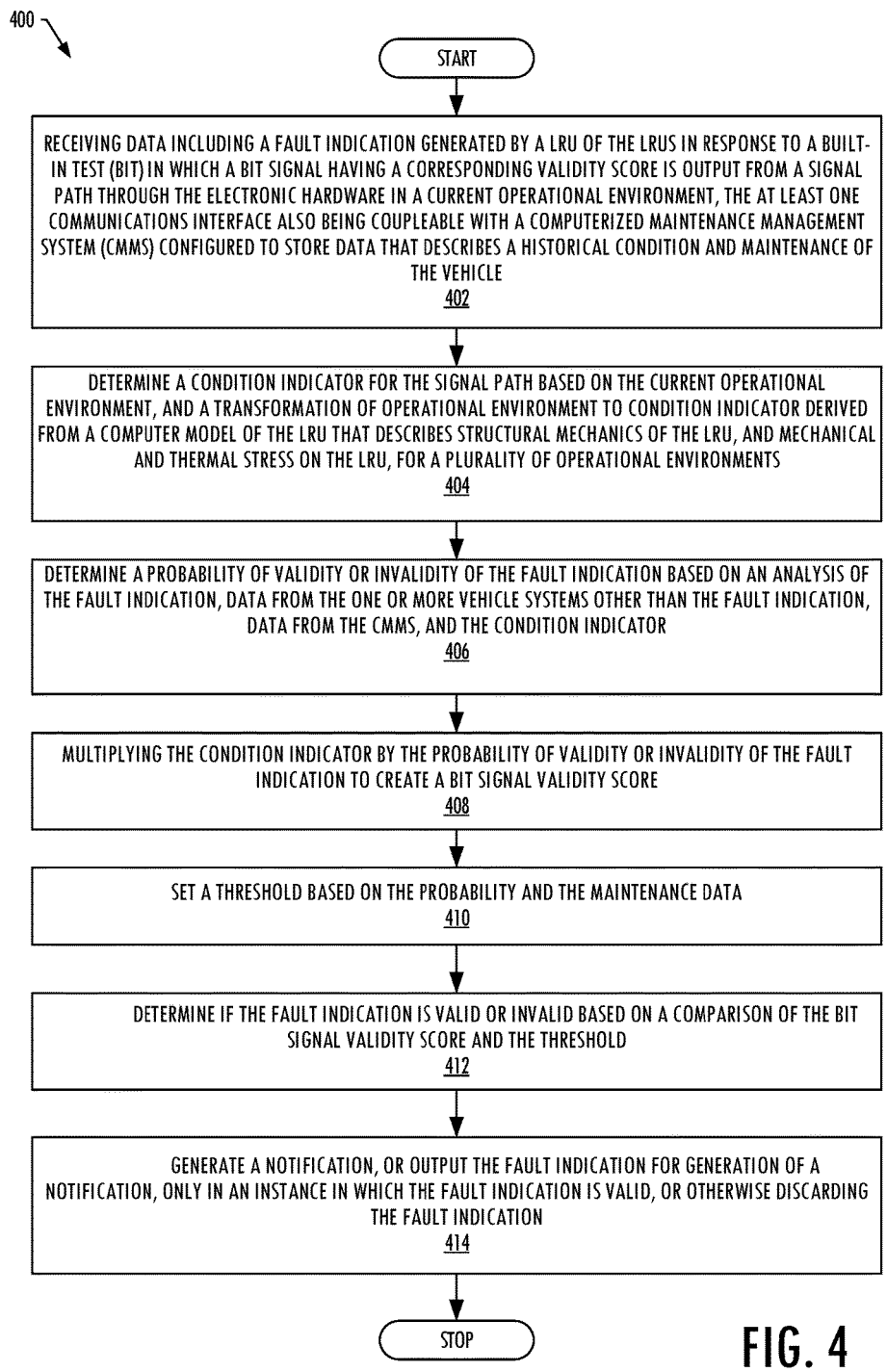
FIG. 4 is a flow diagram illustrating various operations of a method for reducing nuisance fault indications from a vehicle using physics-based and data-driven models, in accordance with an example implementation.

FIG. 4 illustrates a flowchart including various operations of a method 400 for reducing nuisance fault indications from a vehicle equipped with LRUs including electronic hardware, and VHM system. As shown at block 402, the method includes receiving, by at least one communications interface coupleable with the VHM, data that describes a current state of the vehicle including a fault indication generated by the LRU in response to a BIT in which a BIT signal is output from a signal path through the electronic hardware in a current operational environment. The at least one communications interface also being coupleable with a CMMS configured to store data that describes a historical condition and maintenance of the vehicle.

The method also includes determining a condition indicator for the signal path based on the current operational environment, and a transformation of operational environment to condition indicator derived from a computer model of the LRU that describes structural mechanics of the LRU, and mechanical and thermal stress on the LRU, for a plurality of operational environments, as shown at block 404. The method also includes determining a probability of validity or invalidity of the fault indication based on an analysis of the fault indication, data from the VHM or another vehicle system, other than the fault indication, data from the CMMS, and the condition indicator, as shown at block 406.

The method also includes multiplying the condition indicator by the probability of validity or invalidity of the fault indication to create a BIT signal validity score, as shown at block 408. The method also includes setting a threshold based on the probability and maintenance data, as shown at block 410. The method also includes determining, by the processing circuitry, if the fault indication is valid or invalid based on a comparison of the BIT signal validity score and the threshold, as shown at block 412. The method also includes generating a notification, or output the fault indication for generation of a notification, only in an instance in which the fault indication is valid, or otherwise discarding the fault indication, as shown at block 414

According to some example implementations of the present disclosure, the vehicle 200 and the off-board data processing unit 202, and their subsystems and/or components including the LRUs 100, vehicle monitoring system (VHM) 204, on-board fault indication system 206 and advanced fault indication system 208, and the computerized maintenance management system (CMMS) 210 may be implemented by various means. Similarly, the advanced fault indication system and its respective subsystems and/or components including the modeler 302, data analysis engine 304, threshold setter 306, and reasoner 308 may be implemented by various means. Means for implementing the systems, subsystems and their respective elements may include hardware, alone or under direction of one or more computer programs from a computer-readable storage medium.

In some examples, one or more apparatuses may be provided that are configured to function as or otherwise implement the systems, subsystems, tools and respective elements shown and described herein. In examples involving more than one apparatus, the respective apparatuses may be connected to or otherwise in communication with one another in a number of different manners, such as directly or indirectly via a wired or wireless network or the like.

Figure 5:
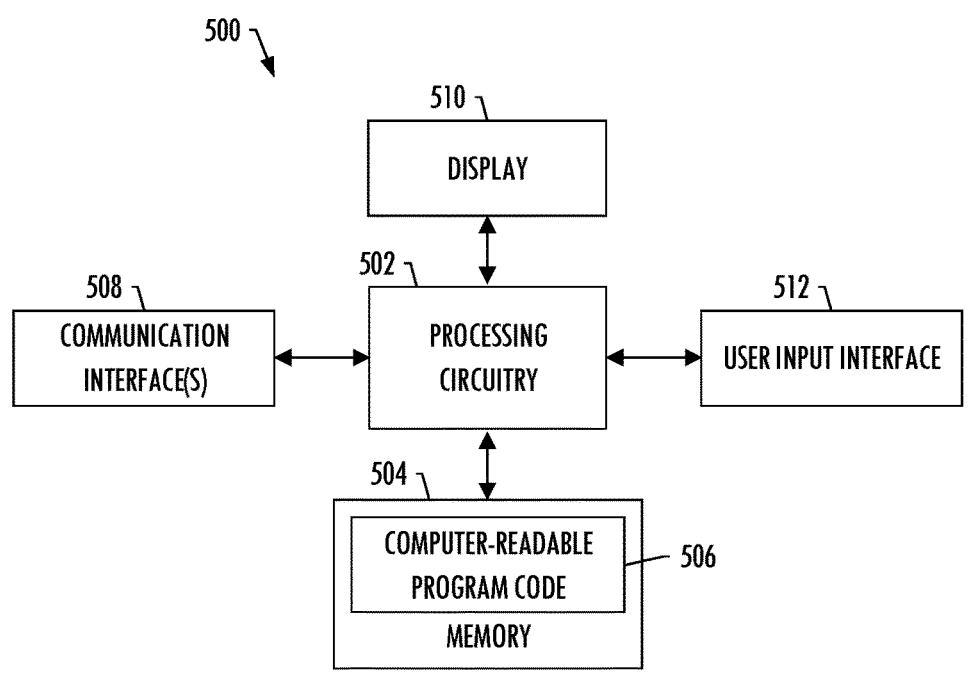
FIG. 5 illustrates an apparatus according to some example implementations.

FIG. 5 illustrates an apparatus 500 according to some example implementations of the present disclosure. Generally, an apparatus of example implementations of the present disclosure may comprise, include or be embodied in one or more fixed or portable electronic devices. Examples of suitable electronic devices include a smartphone, tablet computer, laptop computer, desktop computer, workstation computer, server computer or the like. The apparatus may include one or more of each of a number of components such as, for example, a processing circuitry 502 (e.g., processor unit) connected to a memory 504 (e.g., storage device).

The processing circuitry 502 is generally any piece of computer hardware that is capable of processing information such as, for example, data, computer programs and/or other suitable electronic information. The processing circuitry is composed of a collection of electronic circuits some of which may be packaged as an integrated circuit or multiple interconnected integrated circuits (an integrated circuit at times more commonly referred to as a "chip"). The processing circuitry may be configured to execute computer programs, which may be stored onboard the processing circuitry or otherwise stored in the memory 504 (of the same or another apparatus).

The processing circuitry 502 may be a number of processing circuitries, a multi-processor core or some other type of processing circuitry, depending on the particular implementation. Further, the processing circuitry may be implemented using a number of heterogeneous processor systems in which a main processing circuitry is present with one or more secondary processing circuitries on a single chip. As another illustrative example, the processing circuitry may be a symmetric multi-processor system containing multiple processing circuitries of the same type. In yet another example, the processing circuitry may be embodied as or otherwise include one or more application-specific integrated circuits (ASICs), field-programmable gate arrays (FPGAs) or the like. Thus, although the processing circuitry may be capable of executing a computer program to perform one or more functions, the processing circuitry of various examples may be capable of performing one or more functions without the aid of a computer program.

The memory 504 is generally any piece of computer hardware that is capable of storing information such as, for example, data, computer programs (e.g., computer-readable program code 506) and/or other suitable information either on a temporary basis and/or a permanent basis. The memory may include volatile and/or non-volatile memory, and may be fixed or removable. Examples of suitable memory include random access memory (RAM), read-only memory (ROM), a hard drive, a flash memory, a thumb drive, a removable computer diskette, an optical disk, a magnetic tape or some combination of the above. Optical disks may include compact disk-read only memory (CD-ROM), compact disk-read/write (CD-R/W), DVD or the like. In various instances, the memory may be referred to as a computer-readable storage medium. The computer-readable storage medium is a non-transitory device capable of storing information, and is distinguishable from computer-readable transmission media such as electronic transitory signals capable of carrying information from one location to another. Computer-readable medium as described herein may generally refer to a computer-readable storage medium or computer-readable transmission medium.

In addition to the memory, the processing circuitry may also be connected to one or more interfaces for displaying, transmitting and/or receiving information. The interfaces may include a communications interface (e.g., communications unit) and/or one or more user interfaces. The communications interface may be configured to transmit and/or receive information, such as to and/or from other apparatus(es), network(s) or the like. The communications interface may be configured to transmit and/or receive information by physical (wired) and/or wireless communications links. Examples of suitable communication interfaces include a network interface controller (NIC), wireless NIC (WNIC) or the like.

The user interfaces may include a display 510 and/or one or more user input interfaces 512 (e.g., input/output unit). The display may be configured to present or otherwise display information to a user, suitable examples of which include a liquid crystal display (LCD), light-emitting diode display (LED), plasma display panel (PDP) or the like.

The user input interfaces 512 may be wired or wireless, and may be configured to receive information from a user into the apparatus, such as for processing, storage and/or display. Suitable examples of user input interfaces include a microphone, image or video capture device, keyboard or keypad, joystick, touch-sensitive surface (separate from or integrated into a touchscreen), biometric sensor or the like. The user interfaces may further include one or more interfaces for communicating with peripherals such as printers, scanners or the like.

As indicated above, program code instructions may be stored in memory, and executed by a processing circuitry, to implement functions of the systems, subsystems and their respective elements described herein. As will be appreciated, any suitable program code instructions may be loaded onto a computer or other programmable apparatus from a computer-readable storage medium to produce a particular machine, such that the particular machine becomes a means for implementing the functions specified herein. These program code instructions may also be stored in a computer-readable storage medium that can direct a computer, a processing circuitry or other programmable apparatus to function in a particular manner to thereby generate a particular machine or particular article of manufacture. The instructions stored in the computer-readable storage medium may produce an article of manufacture, where the article of manufacture becomes a means for implementing functions described herein. The program code instructions may be retrieved from a computer-readable storage medium and loaded into a computer, processing circuitry or other programmable apparatus to configure the computer, processing circuitry or other programmable apparatus to execute operations to be performed on or by the computer, processing circuitry or other programmable apparatus.

Retrieval, loading and execution of the program code instructions may be performed sequentially such that one instruction is retrieved, loaded and executed at a time. In some example implementations, retrieval, loading and/or execution may be performed in parallel such that multiple instructions are retrieved, loaded, and/or executed together. Execution of the program code instructions may produce a computer-implemented process such that the instructions executed by the computer, processing circuitry or other programmable apparatus provide operations for implementing functions described herein.

Execution of instructions by a processing circuitry, or storage of instructions in a computer-readable storage medium, supports combinations of operations for performing the specified functions. In this manner, an apparatus 500 may include a processing circuitry 502 and a computer-readable storage medium or memory 504 coupled to the processing circuitry, where the processing circuitry is configured to execute computer-readable program code 506 stored in the memory. It will also be understood that one or more functions, and combinations of functions, may be implemented by special purpose hardware-based computer systems and/or processing circuitries which perform the specified functions, or combinations of special purpose hardware and program code instructions.

Many modifications and other implementations of the disclosure set forth herein will come to mind to one skilled in the art to which the disclosure pertains having the benefit of the teachings presented in the foregoing description and the associated drawings. Therefore, it is to be understood that the disclosure is not to be limited to the specific implementations disclosed and that modifications and other implementations are intended to be included within the scope of the appended claims. Moreover, although the foregoing description and the associated drawings describe example implementations in the context of certain example combinations of elements and/or functions, it should be appreciated that different combinations of elements and/or functions may be provided by alternative implementations without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

Many modifications and other implementations of the disclosure set forth herein will come to mind to one skilled in the art to which the disclosure pertains having the benefit of the teachings presented in the foregoing description and the associated drawings. Therefore, it is to be understood that the disclosure is not to be limited to the specific implementations disclosed and that modifications and other implementations are intended to be included within the scope of the appended claims. Moreover, although the foregoing description and the associated drawings describe example implementations in the context of certain example combinations of elements and/or functions, it should be appreciated that different combinations of elements and/or functions may be provided by alternative implementations without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. An off-board apparatus for reducing nuisance fault indications from a vehicle equipped with line replaceable units (LRUs) including electronic hardware, the apparatus being communicably coupled to a vehicle health monitoring (VHM) system, or one or more vehicle systems for at least collecting and communicating data thereto, the apparatus comprising:

at least one communications interface coupleable with the VHM or the one or more vehicle systems to enable the apparatus to receive data including a fault indication generated by a LRU of the LRUs in response to a built-in test (BIT) in which a BIT signal is output from a signal path through the electronic hardware in a current operational environment, the at least one communications interface also being coupleable with a computerized maintenance management system (CMMS) configured to store data that describes a historical condition and maintenance of the vehicle; and processing circuitry coupled to the at least one communications interface and programmed to at least:

determine a condition indicator for the signal path based on the current operational environment, and a transformation of operational environment to condition indicator derived from a computer model of the LRU that describes structural mechanics of the LRU, and mechanical and thermal stress on the LRU, for a plurality of operational environments;

determine a probability of validity or invalidity of the fault indication based on an analysis of the fault indication, data from the one or more vehicle systems other than the fault indication, data from the CMMS, and the condition indicator;

multiply the condition indicator by the probability of validity or invalidity of the fault indication to create a BIT signal validity score;

set a threshold based on the probability and the maintenance data;

determine if the fault indication is valid or invalid based on a comparison of the BIT signal validity score and the threshold; and generate a notification, or output the fault indication for generation of a notification, only in an instance in which the fault indication is valid, or otherwise discarding the fault indication.

2. The apparatus of claim 1, wherein the operational environment is defined by at least one of a temperature, humidity, vibration, age or shock factor for the electronic hardware, or interaction between the LRU and at least one other LRU.

3. The apparatus of claim 1, wherein the data from the CMMS from which the probability is determined includes historical fault indications for the LRU, each of which is indicated as valid or invalid, based on historical effectiveness of repairs and maintenance actions for the LRU.

4. The apparatus of claim 1, wherein the data from the one or more vehicle systems other than the fault indication from which the probability is determined includes parameters that describe the current operational environment.

5. The apparatus of claim 1, wherein the processing circuitry is further programmed to derive the transformation, including for each operational environment of the plurality of operational environments, the processing circuitry being programmed to at least:
configure the computer model to describe structural mechanics of the electronic hardware, and mechanical and thermal stress on the electronic hardware, for the LRU operational environment; and with the computer model so configured,
apply an input signal to the computer model to cause an output signal from a corresponding signal path for the signal path through the electronic hardware; and
determine a condition indicator for the signal path for the LRU operational environment based on the input signal and the output signal.

6. The apparatus of claim 1, wherein the processing circuitry being programmed to determine if the fault indication is valid or invalid includes being programmed to determine that the BIT signal is valid in an instance in which the BIT signal validity score is less than the threshold that defines an upper acceptable limit, or greater than the threshold that defines a lower acceptable limit.

7. The apparatus of claim 1, wherein the processing circuitry being programmed to generate the notification, or output the fault indication for generation of the notification, includes being programmed to output the notification or the fault indication to the CMMS to cause the CMMS to automatically schedule a maintenance activity for the LRU based thereon.

8. A method for reducing nuisance fault indications from a vehicle equipped with line replaceable units (LRUs) including electronic hardware using an advance fault indication system, the advanced fault indication system being communicably coupled to a vehicle health monitoring (VHM) system, or one or more vehicle systems for at least collecting and communicating data thereto, the method comprising:
receiving, by at least one communications interface coupleable with the VHM, data including a fault indication generated by a LRU of the LRUs in response to a built-in test (BIT) in which a BIT signal having a corresponding validity score is output from a signal path through the electronic hardware in a current operational environment, the at least one communications interface also being coupleable with a computerized maintenance management system (CMMS) configured to store data that describes a historical condition and maintenance of the vehicle;
determining, by the processing circuitry, a condition indicator for the signal path based on the current operational environment, and a transformation of operational environment to condition indicator derived from a computer model of the LRU that describes structural mechanics of the LRU, and mechanical and thermal stress on the LRU, for a plurality of operational environments;
determining a probability of validity or invalidity of the fault indication based on an analysis of the fault indication, data from the one or more vehicle systems other than the fault indication, data from the CMMS, and the condition indicator;
multiplying the condition indicator by the probability of validity or invalidity of the fault indication to create a BIT signal validity score;
setting, by the processing circuitry, a threshold based on the probability and the maintenance data;
determining, by the processing circuitry, if the fault indication is valid or invalid based on a comparison of the BIT signal validity score and the threshold; and
generating, by the processing circuitry, a notification, or output the fault indication for generation of a notification, only in an instance in which the fault indication is valid, or otherwise discarding the fault indication.

9. The method of claim 8, wherein the operational environment is defined by at least one of a temperature, humidity, vibration, age or shock factor for the electronic hardware, or interaction between the LRU and at least one other LRU.

10. The method of claim 8, wherein the data from the CMMS from which the probability is determined includes historical fault indications for the LRU, each of which is indicated as valid or invalid based on historical effectiveness of repairs, fault indications and maintenance actions for the LRU.

11. The method of claim 8, wherein the data from the one or more vehicle systems other than the fault indication from which the probability is determined includes parameters that describe the current operational environment.

12. The method of claim 8 further comprising deriving, by the processing circuitry, the transformation, including for each operational environment of the plurality of operational environments:
configuring the computer model to describe structural mechanics of the electronic hardware, and mechanical and thermal stress on the electronic hardware, for the LRU operational environment; and with the computer model so configured,
applying an input signal to the computer model to cause an output signal from a corresponding signal path for the signal path through the electronic hardware; and
determining a condition indicator for the signal path for the LRU operational environment based on the input signal and the output signal.

13. The method of claim 8, wherein determining if the fault indication is valid or invalid includes determining that the BIT signal is valid in an instance in which a value of the BIT signal validity score is less than the threshold that defines an upper acceptable limit, or greater than the threshold that defines a lower acceptable limit.

14. The method of claim 8, wherein generating the notification, or output the fault indication for generation of the notification, includes outputting the notification or the fault indication to the CMMS to cause the CMMS to automatically schedule a maintenance activity for the LRU based thereon.

15. A non-transitory computer-readable storage medium for reducing nuisance fault indications from a vehicle equipped with line replaceable units (LRUs) including electronic hardware using an advance fault indication system, the advanced fault indication system being communicably coupled to a vehicle health monitoring (VHM) system, or one or more vehicle systems for at least collecting and communicating data thereto, the computer-readable storage medium having computer-readable program code stored therein that, in response to execution by processing circuitry, cause an apparatus to at least:

receive, by at least one communications interface coupleable with the VHM, data including a fault indication generated by a LRU of the LRUs in response to a built-in test (BIT) in which a BIT signal having a corresponding validity score is output from a signal path through the electronic hardware in a current operational environment, the at least one communications interface also being coupleable with a computerized maintenance management system (CMMS) configured to store data that describes a historical condition and maintenance of the vehicle;

determine a condition indicator for the signal path based on the current operational environment, and a transformation of operational environment to condition indicator derived from a computer model of the LRU that describes structural mechanics of the LRU, and mechanical and thermal stress on the LRU, for a plurality of operational environments;

determine a probability of validity or invalidity of the fault indication based on an analysis of the fault indication, data from the one or more vehicle systems other than the fault indication, data from the CMMS, and the condition indicator;

multiply the condition indicator by the probability of validity or invalidity of the fault indication to create a BIT signal validity score;

set a threshold based on the probability and the maintenance data;

determine if the fault indication is valid or invalid based on a comparison of the BIT signal validity score and the threshold; and generate a notification, or output the fault indication for generation of a notification, only in an instance in which the fault indication is valid, or otherwise discarding the fault indication.

16. The non-transitory computer readable storage medium of claim 15, wherein the operational environment is defined by at least one of a temperature, humidity, vibration, age or shock factor for the electronic hardware, or interaction between the LRU and at least one other LRU.

17. The non-transitory computer readable storage medium of claim 15, wherein the data from the CMMS from which the probability is determined includes historical fault indications for the LRU, each of which is indicated as valid or invalid based on historical effectiveness of repairs and maintenance actions for the LRU.

18. The non-transitory computer readable storage medium of claim 15, wherein the data from the one or more vehicle systems other than the fault indication from which the probability is determined includes parameters that describe the current operational environment.

19. The non-transitory computer readable storage medium of claim 15, wherein the apparatus is further caused to at least derive the transformation, including for each operational environment of the plurality of operational environments, the apparatus being caused to at least:

configure the computer model to describe structural mechanics of the electronic hardware, mechanical and thermal stress on the electronic hardware, for the LRU operational environment; and with the computer model so configured, apply an input signal to the computer model to cause an output signal from a corresponding signal path for the signal path through the electronic hardware; and determine a condition indicator for the signal path for the LRU operational environment based on the input signal and the output signal.

20. The non-transitory computer readable storage medium of claim 15, wherein the apparatus being caused to determine if the fault indication is valid or invalid includes being caused to determine that the BIT signal is valid in an instance in which a value of the BIT signal validity score is less than the threshold that defines an upper acceptable limit, or greater than the threshold that defines a lower acceptable limit.

21. The non-transitory computer readable storage medium of claim 15, wherein the apparatus being caused to generate the notification, or output the fault indication for generation of the notification, includes being caused to output the notification or the fault indication to the CMMS to cause the CMMS to automatically schedule a maintenance activity for the LRU based thereon.

* * * * *